US007104807B1

(12) United States Patent
Wang et al.

(10) Patent No.: US 7,104,807 B1
(45) Date of Patent: Sep. 12, 2006

(54) APPARATUS FOR AN IMPROVED PERIPHERAL ELECTRONIC INTERCONNECT DEVICE

(75) Inventors: Kuang-Yu Wang, Saratoga, CA (US); Ren-Kang Chiou, Fremont, CA (US); Edward W. Lee, Mountain View, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 10/888,105

(22) Filed: Jul. 9, 2004

(51) Int. Cl.
*H01R 12/00* (2006.01)
*H05K 5/14* (2006.01)

(52) U.S. Cl. .................... 439/76.1; 439/660; 439/638; 361/737; 361/785

(58) Field of Classification Search ............... 439/76.1, 439/374, 638, 946, 951, 660; 361/737, 752, 361/785
See application file for complete search history.

(56) References Cited

U.S. PATENT DOCUMENTS 5,330,360 A 7/1994 Marsh et al. .............. 439/76.1
5,339,222 A 8/1994 Simmons et al. ........... 361/818
5,386,340 A 1/1995 Kurz .......................... 361/737
5,420,412 A 5/1995 Kowalski .................... 235/492
5,450,396 A 9/1995 Havermans ................. 370/385
5,476,387 A 12/1995 Ramey et al. ............. 439/76.1
5,725,395 A 3/1998 Lee et al. ................... 439/610
5,941,733 A 8/1999 Lai et al. .................... 439/610
6,027,375 A 2/2000 Wu et al. ................... 439/607
6,091,605 A 7/2000 Ramey et al. ............. 361/737
6,165,016 A 12/2000 Lai ............................ 439/610
6,314,479 B1 11/2001 Frederick et al. ............. 710/63
6,334,793 B1 1/2002 Amoni et al. ............... 439/680
6,354,883 B1 3/2002 Jaing .......................... 439/676
6,385,677 B1 5/2002 Yao ............................ 711/115
6,439,464 B1 8/2002 Fruhauf et al. ............. 235/492
6,453,371 B1 9/2002 Hampson et al. ............. 710/37
6,533,612 B1 3/2003 Lee et al. ................... 439/607
6,561,421 B1 5/2003 Yu ............................. 235/451
6,567,273 B1 5/2003 Liu et al. .................... 361/737
6,578,768 B1 6/2003 Binder et al. ............... 235/442
6,581,122 B1 6/2003 Sarat .......................... 710/310
6,599,152 B1 7/2003 Oliphant et al. ............ 439/660
6,602,088 B1 8/2003 Zhu ........................... 439/382
6,628,498 B1 9/2003 Whitney et al. ............ 361/119
6,658,516 B1 12/2003 Yao ............................ 710/301
6,692,268 B1 2/2004 Kung et al. ................ 439/76.1
6,692,312 B1 2/2004 Semmeling et al. ..... 439/733.1
6,705,902 B1 3/2004 Yi et al. ..................... 439/678
6,712,646 B1 3/2004 Shindo ....................... 439/608
6,719,570 B1 * 4/2004 Tsuchioka .................. 439/76.1
6,745,267 B1 6/2004 Chen et al. .................... 710/74
6,752,321 B1 6/2004 Leaming ..................... 235/492
6,763,408 B1 7/2004 Sonoda ........................ 710/73

(Continued)

OTHER PUBLICATIONS

Internet printouts indicating trademark for Express Card.*

(Continued)

*Primary Examiner*—Michael C. Zarroli
(74) *Attorney, Agent, or Firm*—IP Strategy Group, P.C.

(57) ABSTRACT

A plug for coupling with an industry-standard EXPRESSCARD™ receptacle is described. The plug includes a plurality of plug-side metal contacts disposed on a bottom substrate. The plurality of plug-side metal contacts is configured to electrically couple with receptacle-side metal contacts in the industry-standard EXPRESSCARD™ receptacle. When the plug is disconnected from the industry-standard EXPRESSCARD™ receptacle, the surfaces of the plurality plug-side metal contacts are exposed by not being covered by a top housing.

27 Claims, 18 Drawing Sheets

U.S. PATENT DOCUMENTS

| | | | | |
|---|---|---|---|---|
| 6,778,401 | B1 * | 8/2004 | Yu et al. | 361/752 |
| 6,783,076 | B1 * | 8/2004 | Kondo et al. | 235/492 |
| 6,801,971 | B1 | 10/2004 | Devine et al. | 710/107 |
| 6,813,662 | B1 | 11/2004 | Park | 710/74 |
| 6,854,984 | B1 | 2/2005 | Lee et al. | 439/79 |
| 6,857,897 | B1 | 2/2005 | Conn | 439/490 |
| 6,860,609 | B1 | 3/2005 | Olson et al. | 353/122 |
| 6,871,244 | B1 | 3/2005 | Cahill et al. | 710/62 |
| 6,874,044 | B1 | 3/2005 | Chou et al. | 710/62 |
| 6,890,207 | B1 * | 5/2005 | Kobayashi | 439/374 |
| 6,914,189 | B1 * | 7/2005 | Ling et al. | 174/52.1 |
| 2003/0094490 | A1 | 5/2003 | Lee | 235/441 |
| 2003/0100203 | A1 | 5/2003 | Yen | 439/79 |
| 2003/0104835 | A1 | 6/2003 | Douhet | 455/557 |
| 2003/0145141 | A1 | 7/2003 | Chen et al. | 710/74 |
| 2004/0087213 | A1 | 5/2004 | Kao | 439/638 |
| 2005/0059301 | A1 | 3/2005 | Chou et al. | |

OTHER PUBLICATIONS

"PCI Express* Architecture Initiative Overview," Oct. 2003, 15 pages, Intel.
"PMCIA Connector," Specifications sheet, 1 page, Foxconn.
"Engineering Change Notice: Rounded Chamfer," 1 page.
"Product Specification: PSMCIA Memory Card Connector," Specification No. PS98007 Rev. 2, Dec. 2, 2001, 1 page.
"USB Engineering Change Notice: Pull-up/pull-down resistors," 2 pages.
"7.1.5.1 Low/Full-speed Device Speed Identification," 3 pages.
Larky et al., "You've Come a Long Way, USB (history and future of USB port technology)," Electronic News, Jul. 23, 2001, 2 pages.
Brewer et al., "PCI Express Technology," Feb. 2004 White Paper, Dell, pp. 1-11.
"Errata for 'USB Revision 2.0 Apr. 27, 2000' as of May 28, 2002," 7 pages.
"Design Objectives: ExpressCard Connector," 108-5923, Aug. 27, 2003, Tyco Electronics, pp. 1-10.
"USB 2.0 Specification Engineering Change Notice (ECN) #1: Mini-B connector," Oct. 20, 2000, 23 pages.
"Errata for 'USB Revision 2.0 Apr. 27, 2000' as of Dec. 7, 2000," pp. 1-31.
"ExpressCard(TM) Technology: The New Standard for High-Performance, Low-Cost I/O Expansion for Desktop and Mobile Systems," 1 page.
"The ExpressCard(TM) Standard—The Next Generation PC Card Technology," Oct. 2003, PCMCIA, 1 page.
"USB Engineering Change Notice: Interface Association Descriptors," 5 pages.
"On-The-Go Supplement to the USB 2.0 Specification: Revision 1.0a," Jun. 24, 2003, 77 pages.
Bhatt et al., "Creating a Third Generation I/O Interconnect," www.express-lane.org, pp. 1-11.
"PMCIA Socket Connector," Specifications, 1 page, FoxConn.
"Across the Board Backplane Solutions," 1 page diagram.
"Application Consideration and Markets for Connectors," 1 page.
"Electronic Interconnect Devices (Connectors)," 3 pages.
"Reference Material: A guide to connector terminology," 12 pages.
"Diagram for Tyco," 5 pages.
U.S. Appl. No. 10/834,457; filed Apr. 28, 2004; Chou et al.
U.S. Appl. No. 10/835,423; filed Apr. 28, 2004; Chou et al.
U.S. Appl. No. 10/834,615; filed Apr. 28, 2004; Chou et al.
U.S. Appl. No. 10/938,691; filed Sep. 10, 2004; Chou et al.
U.S. Appl. No. 10/939,051; filed Sep. 10, 2004; Chou et al.
PQI web site Our products page (3 pages) http://www.pqi.com.tw/eng/ourproduct/ourproduct.htm.
"Notice of Office Action," for U.S. Appl. No. 10/834,457; filed Apr. 28, 2004; Inventors: Chou et al.
"Notice of Office Action," for U.S. Appl. No. 10/835;423; filed Apr. 28, 2004; Inventors: Chou et al.
"Notice of Office Action," for U.S. Appl. No. 10/834,615; filed Apr. 28, 2004; Inventors: Chou et al.
"Notice of Office Action," for U.S. Appl. No. 10/938,691; filed Sep. 10, 2004; Inventors: Chou et al.
"Notice of Office Action," for U.S. Appl. No. 10/939,051; filed Sep. 10, 2004; Inventors: Chou et al.
"The ExpressCard Standard—The Next Generation PC Card Technology: The Interface," pp. 3-4.
"ExpressCard Question and Answers," http://www.expresscard.org/web/site/qa.jsp, 6 pages.
"About PCMCIA," http://www.pcmcia.org/about.htm, 5 pages.
Wong, William, "ExpressCard: Changing The Face Of Computing," Electronic Design, ED Online ID#6608, http://www.elecdesign.com/Articles/Index.cfm?AD=1&ArticleID=6608, Nov. 24, 2003, 3 pages.
U.S. Appl. No. 10/854,004, filed May 25, 2004; Inventors: Chou et al.
U.S. Appl. No. 11/076,514, filed Mar. 8, 2005; Inventors: Yu et al.
"Notice of Office Action," mailed Mar. 8, 2006, for U.S. Appl. No. 10/834,457, filed Apr. 28, 2004; Inventors: Chou et al.
"Notice of Office Action," mailed Mar. 8, 2006, for U.S. Appl. No. 10/835,423, filed Apr. 28, 2004; Inventors: Chou et al.
"Notice of Office Action," mailed Mar. 7, 2006, for U.S. Appl. No. 10/834,615, filed Sept. 10, 2004; Inventors: Chou et al.
"Notice of Office Action," mailed Feb. 8, 2006, for U.S. Appl. No. 10/938,691, filed on Sept. 10, 2004; Inventors: Chou et al.

* cited by examiner

APPARATUS FOR AN IMPROVED PERIPHERAL ELECTRONIC INTERCONNECT DEVICE

BACKGROUND OF THE INVENTION

The present invention relates in general to computer technologies and in particular to an apparatus for an improved peripheral electronic interconnect device.

The functionality of many modern electronic host devices or hosts (e.g., personal computers, mobile phones, personal digital assistants, game consoles, etc.) can often be expanded by the addition of external devices.

Generally, market adoption of any new technology may be encouraged through the adoption of standards. For example, advances in technology in several areas have converged to bring about high functionality small footprint PC cards. These cards generally use some type of open interface standard (e.g., USB, EXPRESSCARD™, etc.), and are generally configured to communicate through an electronic interconnect device or connector (e.g., peripheral connector, host receptacle connector, etc.).

A common PC card configuration may include a plastic frame for supporting a printed circuit board. Peripheral connectors are typically coupled to one end of the frame for providing an electrical connection to the printed circuit board. Metal or plastic covers are then placed over the frame to shield and protect the printed circuit board. See, for example, U.S. Pat. No. 5,330,360; U.S. Pat. No. 5,339,222; U.S. Pat. No. 5,386,340; and U.S. Pat. No. 5,476,387.

Another type of card configuration does not require the separate plastic frame. In this frameless embodiment, peripheral connectors are separately placed and then soldered to the printed circuit board. The peripheral connectors and the printed circuit board are then covered with top and bottom metallic or plastic covers.

Referring now to FIG. 1, a simplified diagram of a PC card device is shown. Generally, a printed circuit board (PCB) 104 may be coupled to peripheral connector 110, and may be sandwiched between a top cover 102 and a bottom cover 108. As previously stated, plastic frame 106 may be optional in some configurations.

One common open interface standard is Universal Serial Bus (USB). Peripheral devices that implement USB do not generally require a specialized reader host device, but rather can be directly plugged into a USB host connector on a personal computer (PC) or other host device. Included on PC motherboards since 1997, USB is a serial bus architecture in which a USB host controller interface is coupled to the host chipset. USB supports dynamically loadable and unloadable drivers, allowing a user to insert the external device without having to restart the electronic device. The host is able to detect additions, interrogate newly inserted devices, and load appropriate drivers. USB may be commonly used for: wired and wireless LAN, wired PAN, flash memory, flash card adapters, security, legacy I/O (PS2, serial, parallel, optical disk drives, GPS receiver, etc.).

Another more recent standard is PCI Express. PCI Express comprises a multi-drop, parallel bus topology that may contain a host bridge coupled to a CPU, and a switch and several potential endpoints (the I/O devices) coupled to the host chipset. The switch replaces the multi-drop bus and is used to provide fan-out for the I/O bus, providing peer-to-peer communication between different endpoints and this traffic. In addition, because of a relatively low signal-count, simplified and physically smaller point-to-point connections may be constructed with peripheral connectors and cables. PCI Express may be commonly used for: wired LAN, broadband modems, TV tuners/decoders, I/O adapters (e.g., 1394a/b), magnetic disk drives, etc.

In general, peripheral connectors enable the PC card to plug into a port or interface in the host device. Most peripheral and host connectors are either male (containing one or more exposed pins), or a female (containing holes in which the male connector can be inserted). Peripheral and host connectors are commonly comprised of housings and contacts.

Housings protect the peripheral and host connectors against dust, dirt, moisture, electromagnetic interference (EMI), or radio frequency interference (RFI). Housings support contacts to ensure proper mating through keying or polarization and to provide "strain relief" protection to keep peripheral and host connectors united despite accidental pulls or strong vibrations. Mating is the joining of two halves of an electronic interconnect device when a male contact is united with the female contact. Keying is a mechanical means built into a peripheral or host connector housing that indicates the two correct connector halves necessary for mating. Polarization allows only one correct mating alignment of male and female connector halves. The most common metals used for connector contacts are brass, phosphor bronze and beryllium copper. Peripheral and host connector contacts are often plated (e.g., tin, nickel and gold) to increase efficiency and protect against corrosion.

A common contact configuration is stamped/formed. Stamped/formed contacts can be single beam (the receptacle contact holds the plug contact between itself and the housing wall), or dual beam (the female contact holds the male contact between two beams). For example, EXPRESSCARD™ peripheral and host connectors use a type of stamped/formed style called beam-on-blade.

Referring now to FIG. 2, a simplified diagram of a PCI Express configuration for an electronic host device 214 is shown (i.e., PC, PocketPC, mobile phone, PDA, etc.). PCI Express cards may be configured for two card bay configurations 206. ExpressCard/54 202 is typically 54 mm (W)×75 mm (L)×5 mm (H), while ExpressCard/34 204 is typically 34 mm (W)×75 mm (L)×5 mm (H) (these cards are also referred to by engineers and industry publications by the term "ExpressCard" to refer to cards conforming to the standard by the same name). As previously stated, an ExpressCard may be configured to communicate to the host chipset 212 through USB bus 210 or PCI Express bus 208.

Referring now to FIGS. 3A–E, a set of simplified diagrams is shown of an EXPRESSCARD™ peripheral plug connector, at different viewing angles. For purposes of convenience, these three axes have been defined (x, y, z). The x-axis primarily defines width, and hence runs laterally and horizontally across the EXPRESSCARD™, substantially perpendicular to the metal contacts. The y-axis primarily defines height, and hence runs laterally and vertically across the EXPRESSCARD™, and is also substantially perpendicular to both the metal contacts and the x-axis. In addition, the positive direction along the y-axis is toward the top of the EXPRESSCARD™. The z-axis primarily defines length, and hence runs longitudinally across the EXPRESSCARD™, and is also substantially perpendicular to both x-axis and the y-axis. In addition, the positive direction along the z-axis is toward the host device. Subsequently, descriptions of width run along the x-axis, descriptions of height run along the y-axis, and descriptions of length run along the z-axis.

Peripheral plug connector 300 is approximately 34 mm wide, 11 mm long and 5 mm thick. It generally includes lateral guides 302 that allow the user to insert and remove the PC card into receptacle host connector 400, and stopper 312 that generally prevents over insertion of peripheral plug connector 300 into the receptacle host connector 400, as shown in FIGS. 4A–D. Stopper 312 is generally also of a height such that it contacts the bottom surface of receptacle host connector 400 when inserted.

FIG. 3A shows a top isometric view looking at EXPRESSCARD™ peripheral plug connector 300 from rear (PCB side) to the front (host device side), in which a set of metal contacts 310 is exposed, with a height 311 of about 5 mm. As previously described, a peripheral plug connector can both physically and electrically connect a PCB and PC card assembly 306 to a receptacle host connector 400, as shown in FIGS. 4A–D.

Physically, top surface 308 and lateral guides 302 allow PC card assembly 306 to be firmly seated in the receptacle host connector with a specified mating and un-mating force value. In addition, lateral guides 302 also provide finger guides that allow the user to insert and remove the PC card from a host device.

Electrically, the set of metal contacts 310 (or blades) comprise a substantially straight layer for connection to a PCB, and a bended (gull-wing) layer for soldering to PCB substrate. The bended layer may allow the substrate board to be positioned at about the center height position of a PC card. Subsequently, integrated circuits (IC's) or chips and components may be mounted on both top and bottom sides of the PCB substrate.

FIG. 3B shows a top isometric view of peripheral plug connector 300 of FIG. 3A, from the front to the rear (i.e., by rotating the X-Z axis 180 degrees as shown), from the perspective of host device 304.

FIG. 3C shows a bottom isometric view of the peripheral plug connector 300 of FIG. 3A, from the perspective of host device 304. Stopper 312 is shown to prevent peripheral plug connector 300 from being over-inserted into receptacle 400, potentially damaging the set of metal contacts 310.

FIG. 3D shows a bottom isometric view of the peripheral plug connector 300 of FIG. 3A, from the perspective of PCB & PC card assembly 306.

FIG. 3E shows a simplified top down view of the peripheral plug connector perpendicular to the x-z plane. Stopper 312 includes a length 332 and a width 334 that is substantially less than the peripheral plug connector opening width 336.

FIG. 3F shows a simplified side down view of the peripheral plug connector perpendicular to the x-y plane. The peripheral plug connector housing can be functionally divided into three layers: top housing layer 330A, bottom housing layer 330B, and stopper layer 330C. Top housing layer 330A is approximately 2.5 mm in height, and includes the layer of the peripheral plug connector that provides the overhead protection the metal contacts 310 against dust, dirt, moisture, electromagnetic interference (EMI), or radio frequency interference (RFI). It may also provide "strain relief" protection to keep peripheral plug connector and the host receptacle connectors united despite accidental pulls or strong vibrations.

Bottom housing layer 330B includes the layer of the peripheral plug connector that provides the underside protection to the metal contacts 310 against dust, dirt, moisture, electromagnetic interference (EMI), or radio frequency interference (RFI). It may also provide "strain relief" protection to keep peripheral plug connector and the host receptacle connectors united despite accidental pulls or strong vibrations.

Stopper layer includes the layer of the peripheral plug connector that contacts the bottom surface of receptacle host connector 400 when inserted, and prevents over insertion of peripheral plug connector 300 into the receptacle host connector 400, as shown in FIGS. 4A–D. The combined heights of the layers of the peripheral plug connector housing that reside in the bottom housing layer 330B and stopper layer are approximately 2.6 mm.

Referring now to FIGS. 4A–D, a set of simplified diagrams is shown of an EXPRESSCARD™ receptacle host connector. Notice that the orientations shown in FIGS. 4A to 4D are respectively identical to the orientations shown in FIGS. 3A to 3D. FIG. 4A shows a top view of receptacle host connector 400 in which the spring layer of a set of metal contacts 410 (or beams) is exposed. As previously explained, peripheral plug connector 300 and receptacle host connector 400 are designed and built with a set of matching guide rails 302, as shown in FIGS. 3A–E, and guide channels 402 such that they can be easily and accurately mated together. Guide channels 402 provide a substantially U-shaped cavity into which a guide rail 302 may be inserted. Because three sides (350, 352, and 354 of FIG. 3F) of each guide rail 302 are generally in contact with guide channel 402 when the peripheral plug connector and the host receptacle host connector are mated, a specified level of mating and un-mating force is maintained.

FIG. 4B shows a top view of the receptacle host connector 400 of FIG. 4A, from the perspective of host device chipset 404.

FIG. 4C shows a bottom view of the receptacle host connector 400 of FIG. 4A, from the perspective of host device chipset 404.

FIG. 4D shows a bottom view of the receptacle host connector 400 of FIG. 4A, from the perspective of peripheral plug connector 406.

FIG. 4E shows an expanded view of a guide channel 402A, in the x-y plane which is perpendicular to the card longitudinal direction. As previously described, guide channel 402 provide a substantially U-shaped cavity comprising a bottom-height surface 420, a bottom-width-inner surface 422, a height-inner surface 424, a top-inner-width surface 426, and a top-height surface 428.

Referring now to FIG. 5, a simplified diagram of peripheral plug connector 300 is coupled to a receptacle host connector 400. As previously described, receptacle host connector 400 commonly has spring-type metal contacts 410, generally comprising spring-type beam metal contacts that may make physical and electrical contact with a corresponding set of blade metal contacts 310 of peripheral plug connector 300. In addition, stopper 312 generally prevents over insertion of peripheral plug connector 300 into the receptacle host connector 400, as shown in FIGS. 4A–D.

However, as host devices become smaller and are implemented in non-traditional form factors (e.g., mobile phone, digital cameras, watches, etc.) card design flexibility may be substantially advantageous. For example, PC cards which implement the ExpressCard/34 of the specification, with a thickness of about 5 mm, are about half the size of a standard PCMCIA card. Further reductions in size that are still compatible with the appropriate specification would be even more beneficial. For example, in a configuration in which two EXPRESSCARD™ slots are stacked on top of each other, a thinner EXPRESSCARD™ design would allow for the simultaneous use of cards of varying thickness and functionality (i.e., cards that are both less than and greater than 5 mm), as long aggregate thickness as the was less than about 10 mm.

In view of the foregoing, there are desired improved peripheral electronic interconnect device apparatus.

SUMMARY OF THE INVENTION

The invention relates, in one embodiment, to a plug for coupling with an industry-standard EXPRESSCARD™ receptacle. The plug includes a bottom substrate. The plug also includes a plurality of plug-side metal contacts disposed on the bottom substrate, the plurality of plug-side metal contacts being configured for coupling with receptacle-side metal contacts in the industry-standard EXPRESSCARD™ receptacle, thereby rendering the plug electrically compatible with the industry-standard EXPRESSCARD™ receptacle, wherein surfaces of the plurality plug-side metal contacts that couple with the receptacle-side metal contacts are exposed when the plug is disconnected from the industry-standard EXPRESSCARD™ receptacle.

The invention relates, in another embodiment, to a peripheral device configured to be plugged into an industry-standard EXPRESSCARD™ receptacle. The peripheral device includes a plug having a bottom substrate and a plurality of plug-side metal contacts disposed on the bottom substrate, the plurality of plug-side metal contacts being configured for coupling with receptacle-side metal contacts in the industry-standard EXPRESSCARD™ receptacle, thereby rendering the plug electrically compatible with the industry-standard EXPRESSCARD™ receptacle, wherein surfaces of the plurality plug-side metal contacts that couple with the receptacle-side metal contacts are exposed when the plug is disconnected from the industry-standard EXPRESSCARD™ receptacle.

The invention relates, in another embodiment, to a peripheral device configured to be plugged into an industry-standard EXPRESSCARD™ receptacle. The peripheral device includes a circuit board having thereon a plurality of integrated circuit chips. The peripheral device also includes a plug portion integrally formed at one end of the circuit board, the plug portion having a bottom substrate and a plurality of plug-side metal contacts disposed on the bottom substrate, the plurality of plug-side metal contacts being configured for coupling with receptacle-side metal contacts in the industry-standard EXPRESSCARD™ receptacle, thereby rendering the plug portion electrically compatible with the industry-standard EXPRESSCARD™ receptacle, wherein surfaces of the plurality plug-side metal contacts that couple with the receptacle-side metal contacts are exposed when the plug portion is disconnected from the industry-standard EXPRESSCARD™ receptacle.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, PC card design flexibility may be substantially advantageous in host devices that are smaller and implemented in non-traditional form factors (e.g., mobile phone, digital cameras, watches, etc.). Subsequently, further substantial reductions in PC card size that are still compatible with appropriate specifications would be beneficial over current designs. In a non-obvious fashion, PC card thickness may be substantially reduced by also substantially reducing the thickness of an electronic interconnect device in a fashion compatible to corresponding PC card specifications.

In one embodiment, the electronic interconnect device is compatible with the EXPRESSCARD™ standard. In another embodiment, the electronic interconnect device is compatible to the PCMCIA standard. In another embodiment, electronic interconnect device is a plug connector. In yet another embodiment, the peripheral plug connector is stand-alone. In yet another embodiment, the peripheral plug connector is discrete. In yet another embodiment, the peripheral plug connector is integrated into the PC card housing. In yet another embodiment, the peripheral plug connector is directly coupled to pads on a PCB.

Referring now to FIGS. 6A–G, a set of simplified diagrams is shown of an EXPRESSCARD™ peripheral plug connector with a reduced thickness (slim connector), according to one embodiment of the present invention. In a non-obvious way, the thickness of the slim connector has been substantially reduced in a fashion not described in the EXPRESSCARD™ card specification, yet still compatible with that specification. In this manner, the invention allows, in one embodiment, the set of metal contacts 610 of the slim connector to remain in substantially the same position relative to the receptacle host connector 400 of FIGS. 4A–E, as are the set of metal contacts 310 in peripheral plug connector 300, as described in FIGS. 3A–F.

Figure 1:
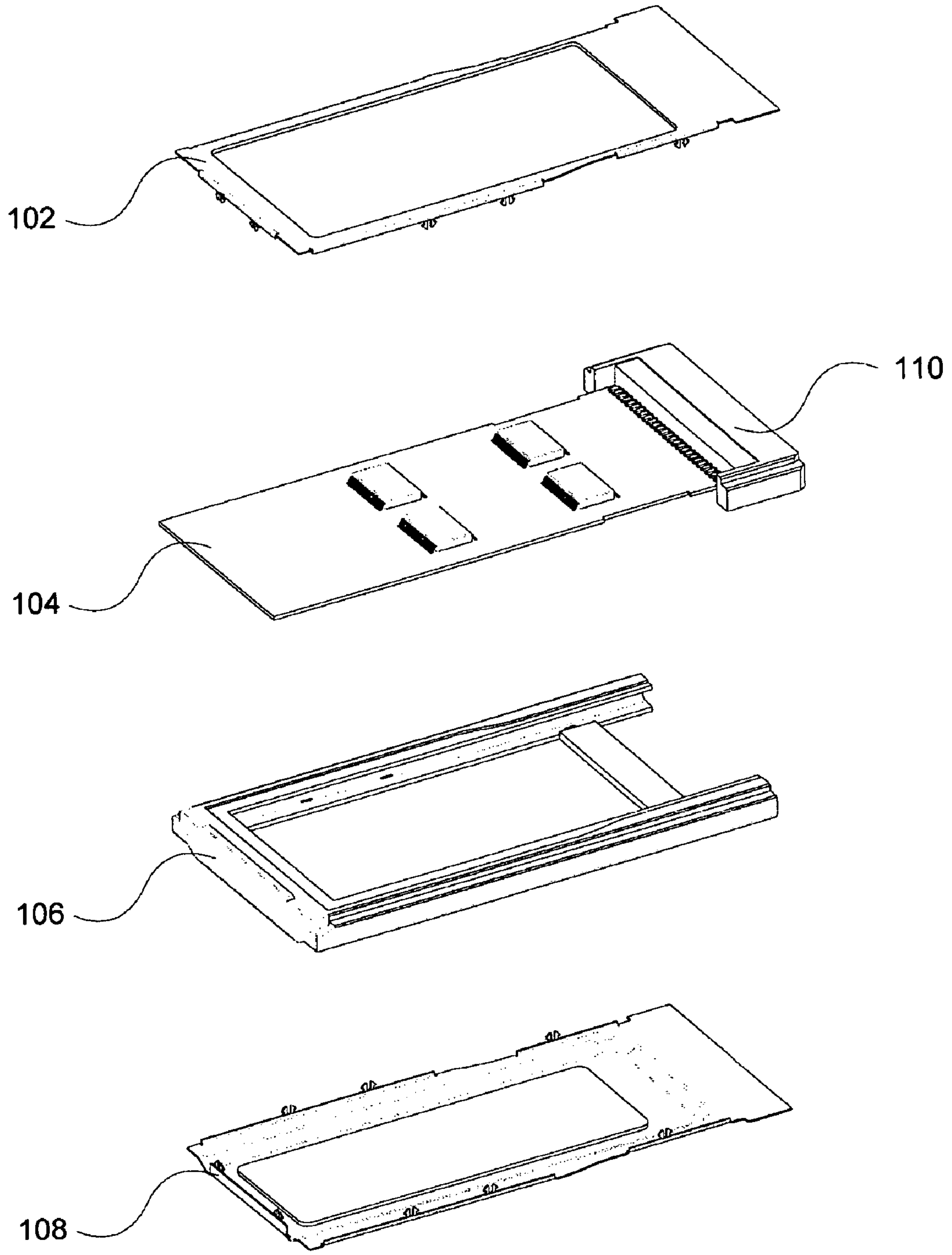
FIG. 1 (PRIOR ART)
FIG. 1 describes a simplified drawings of PC card.
Figure 2:
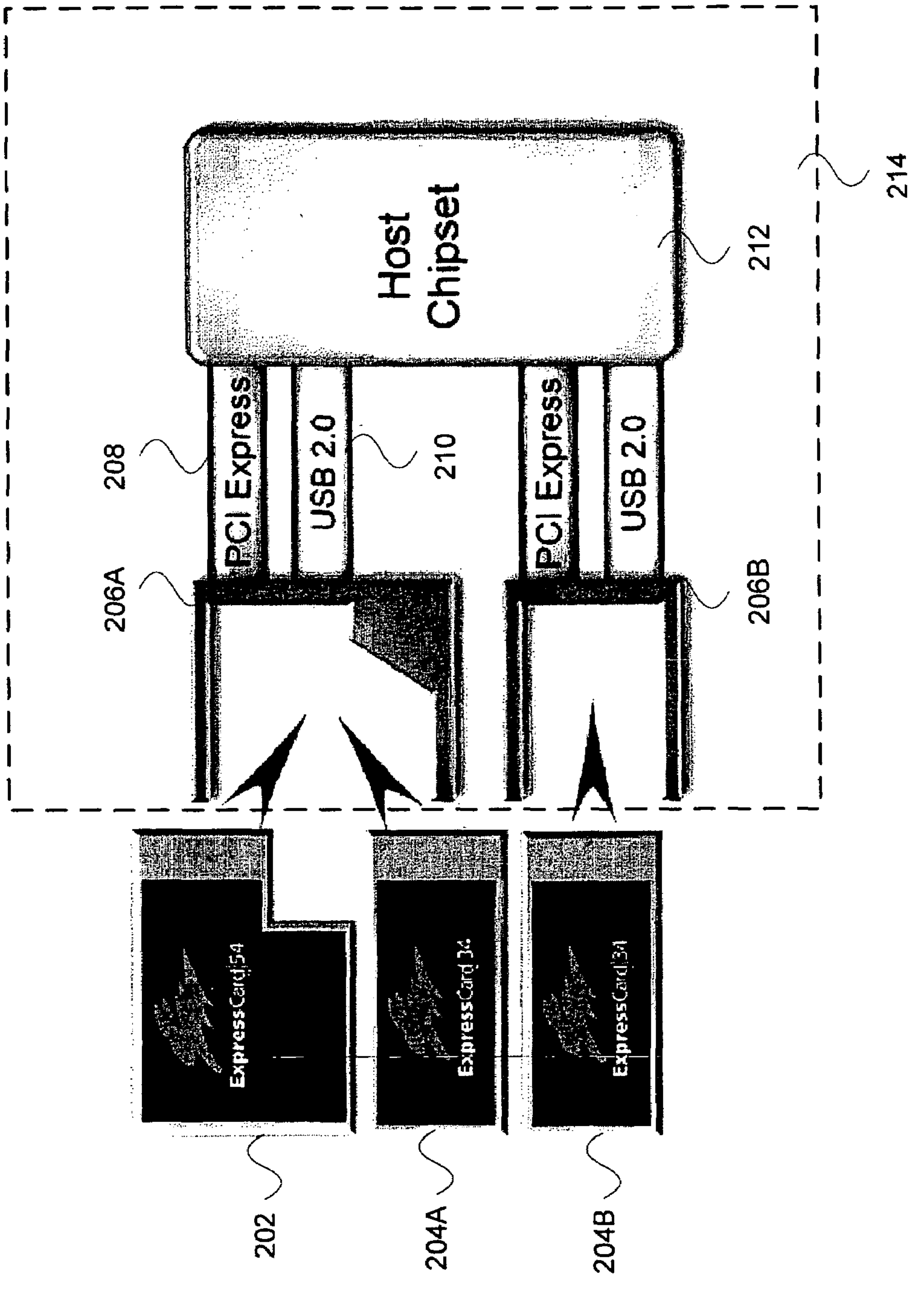
FIG. 2 (PRIOR ART)
FIG. 2 describes a simplified drawings of a EXPRESSCARD™ system interface.
Figure 3A:
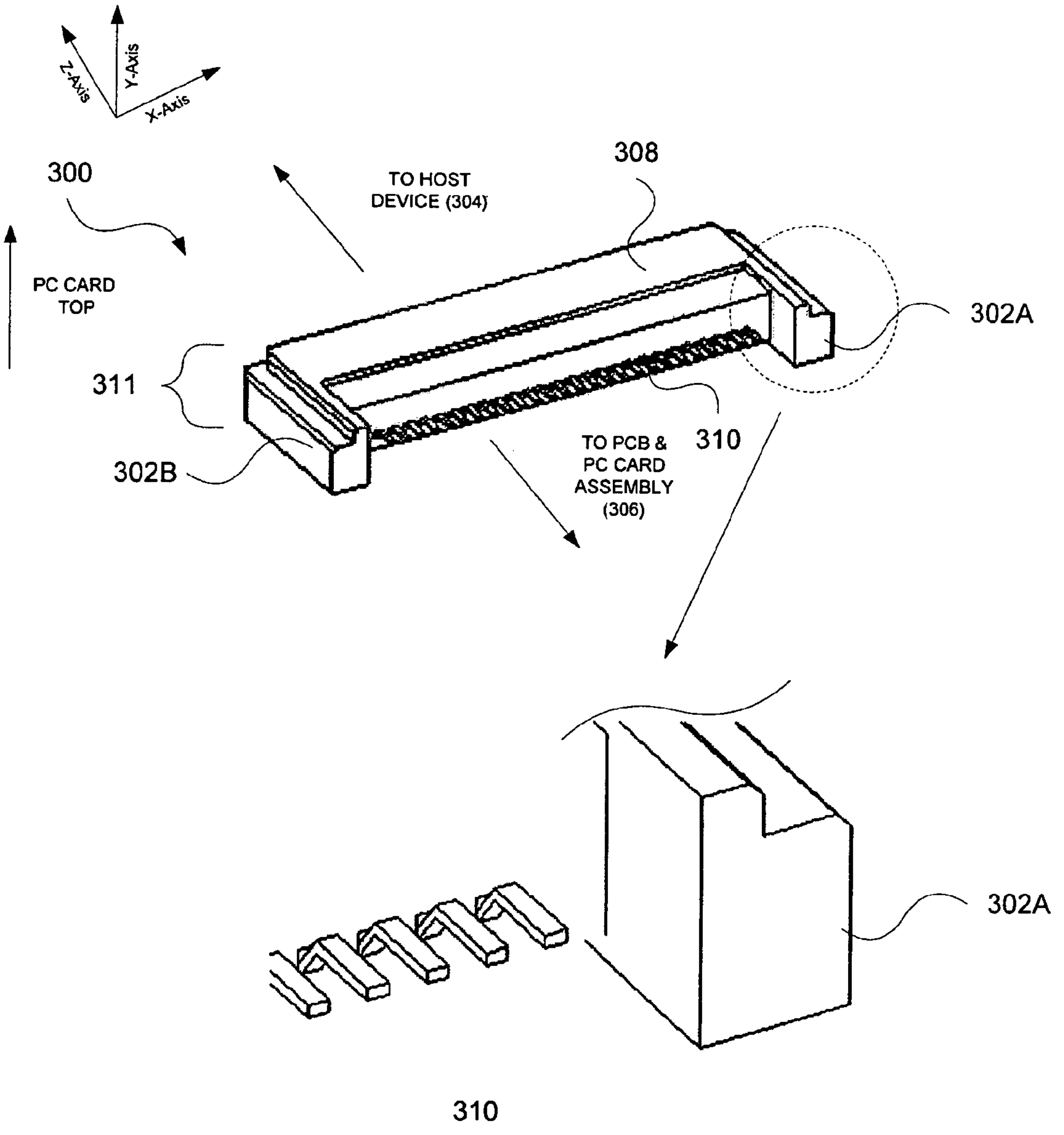
FIG. 3A (PRIOR ART)
FIGS. 3A–F describe an set of simplified drawings of an EXPRESSCARD™ peripheral plug connector.
Figure 3B:
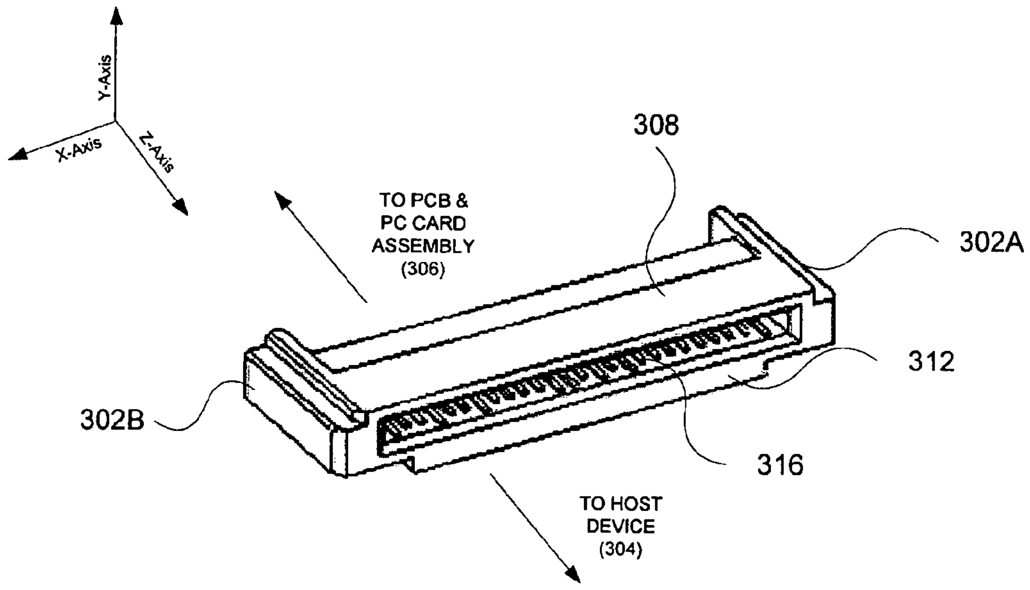
FIG. 3B (PRIOR ART)
Figure 3C:
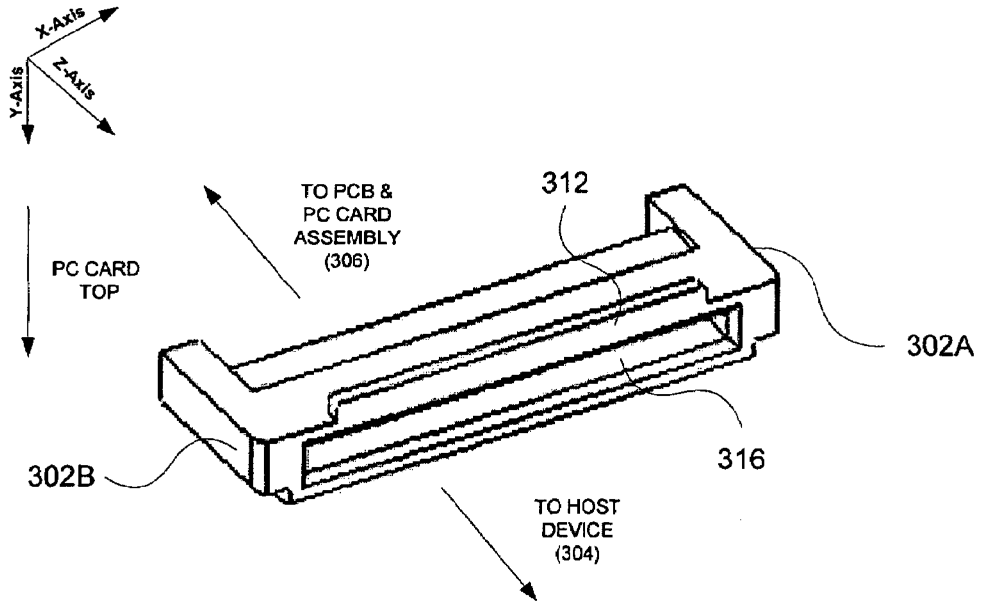
FIG. 3C (PRIOR ART)
Figure 3D:
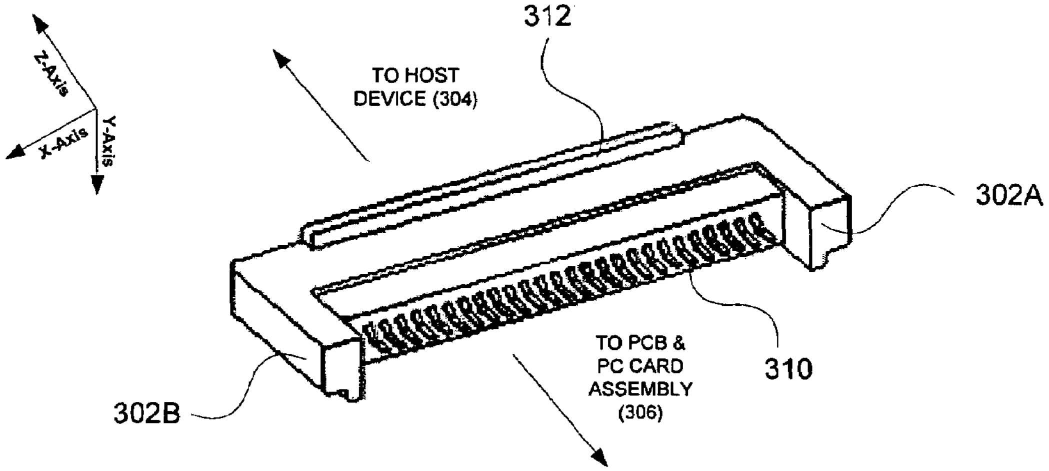
FIG. 3D (PRIOR ART)
Figure 3E:
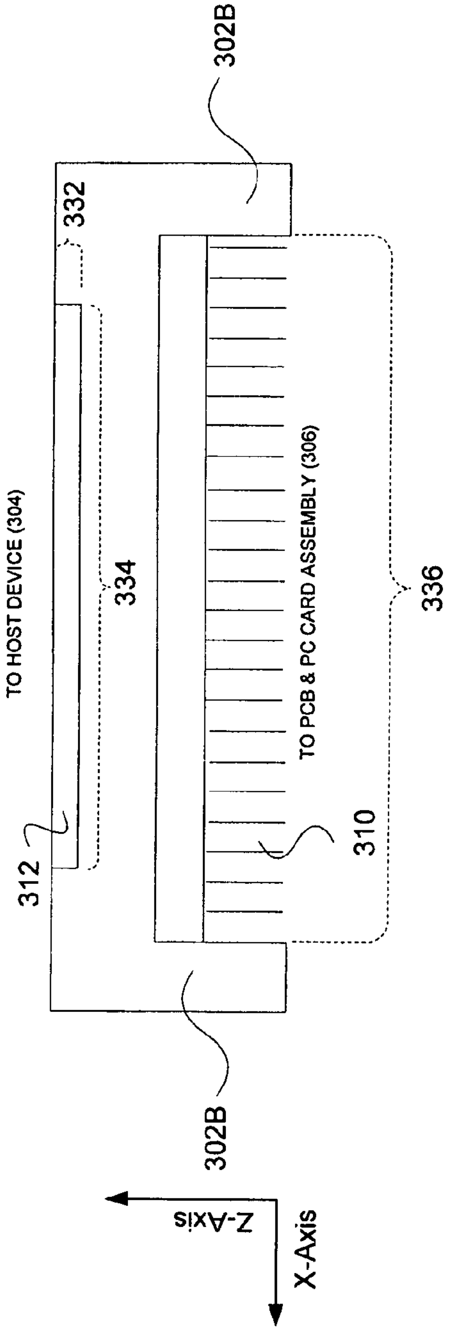
FIG. 3E (PRIOR ART)
Figure 3F:
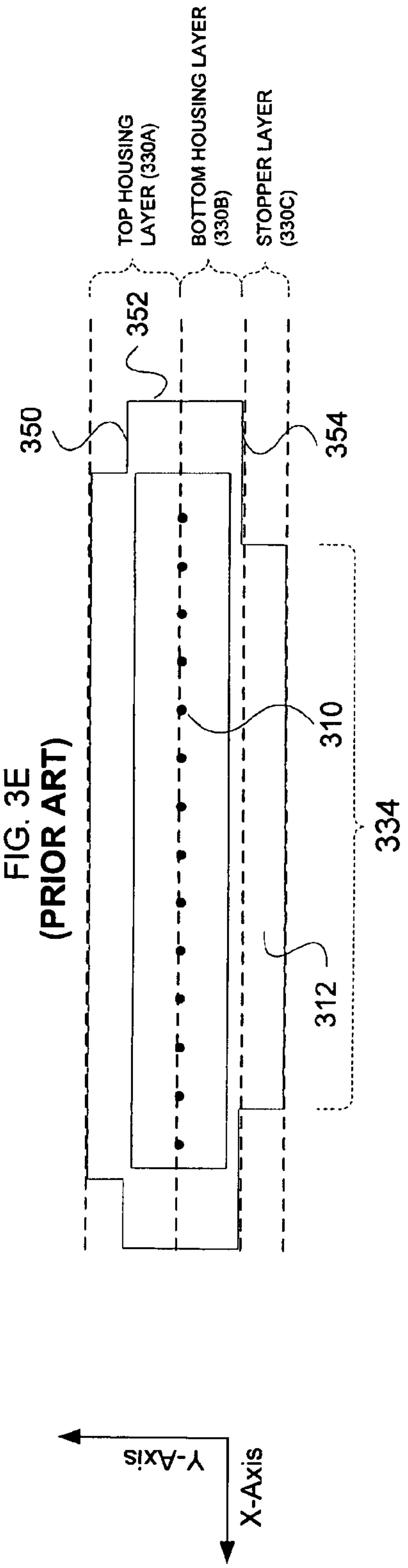
FIG. 3F (PRIOR ART)

In addition, in a non-obvious fashion, the inventor has also provided a mechanism to substantially maintain the amount of force required to mate and un-mate the slim connector with a receptacle by modifying stopper 612 (extended stopper). In general, removing the layer of the peripheral plug connector in the top housing layer 330A, as shown in FIG. 3F, by itself would also tend to decrease the mating and un-mating force requirement, and thus may increase the likelihood of accidentally dislodging the connector.

Figure 4A:
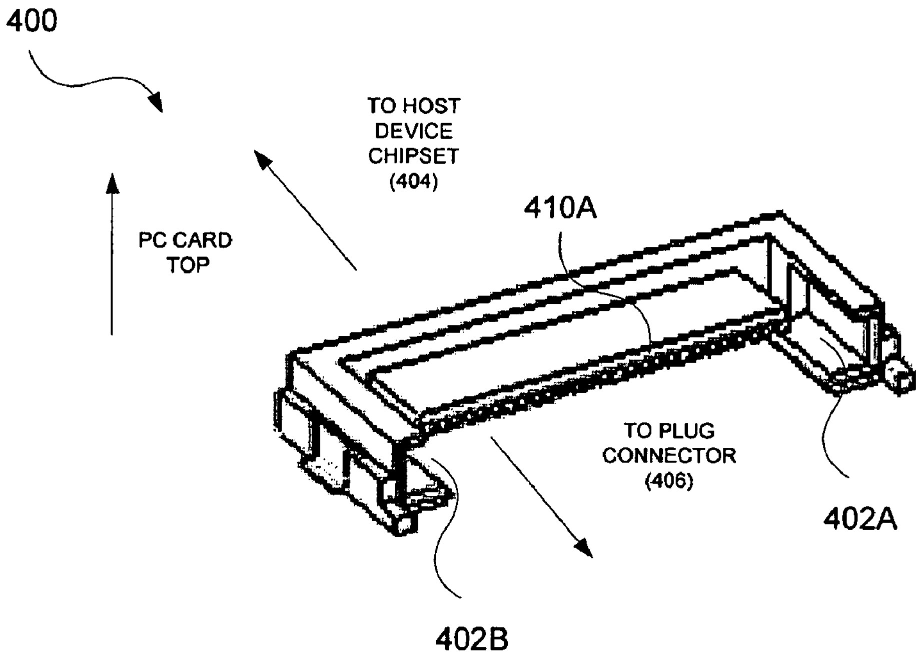
FIG. 4A (PRIOR ART)
FIGS. 4A–E describe set of simplified drawing of an EXPRESSCARD™ host receptacle connector.
Figure 4B:
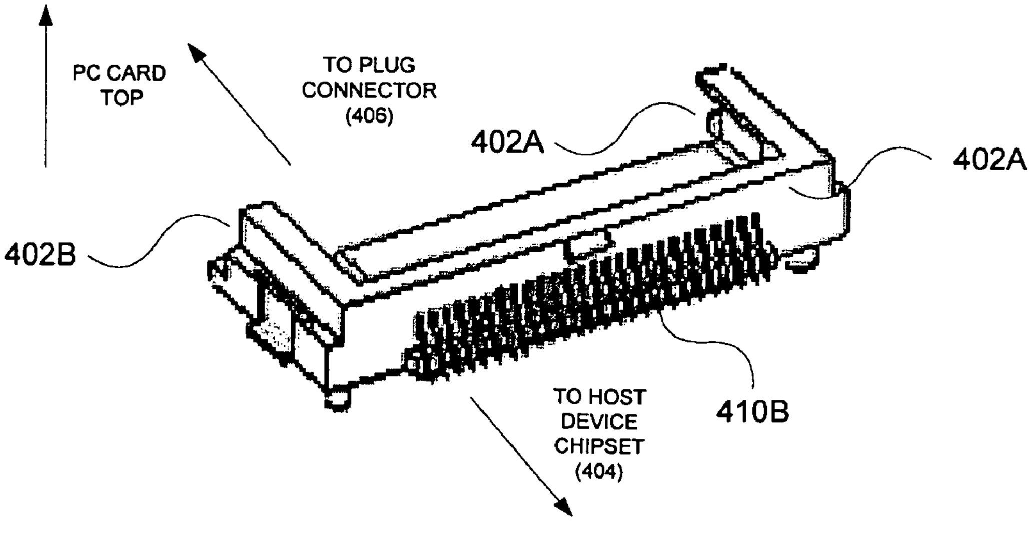
FIG. 4B (PRIOR ART)
Figure 4C:
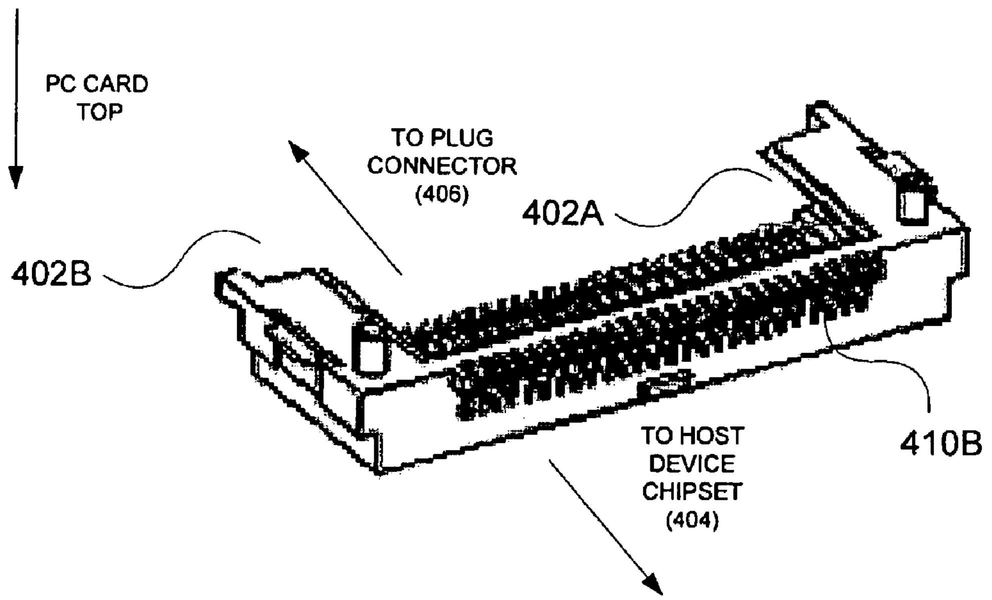
FIG. 4C (PRIOR ART)
Figure 4D:
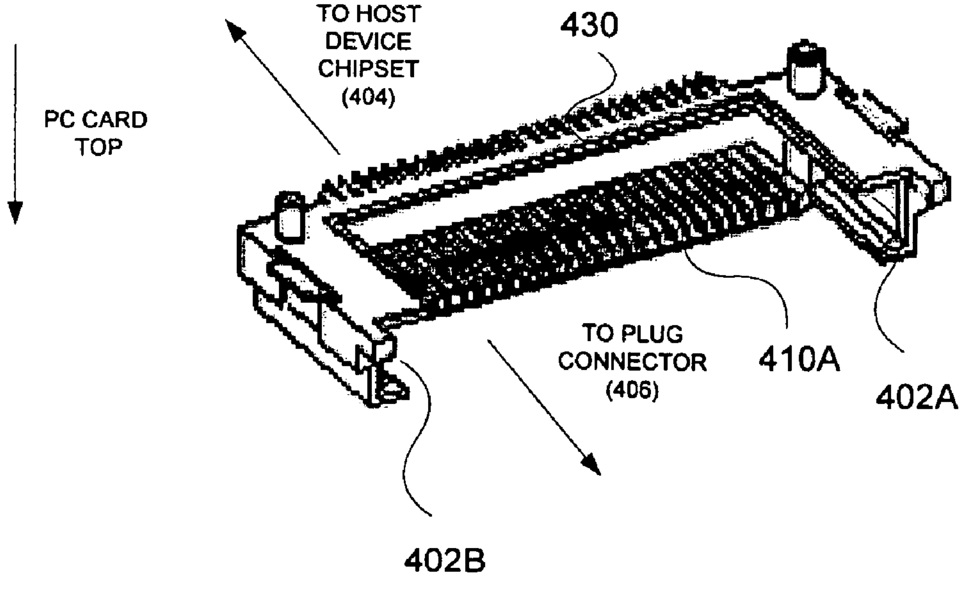
FIG. 4D (PRIOR ART)
Figure 4E:
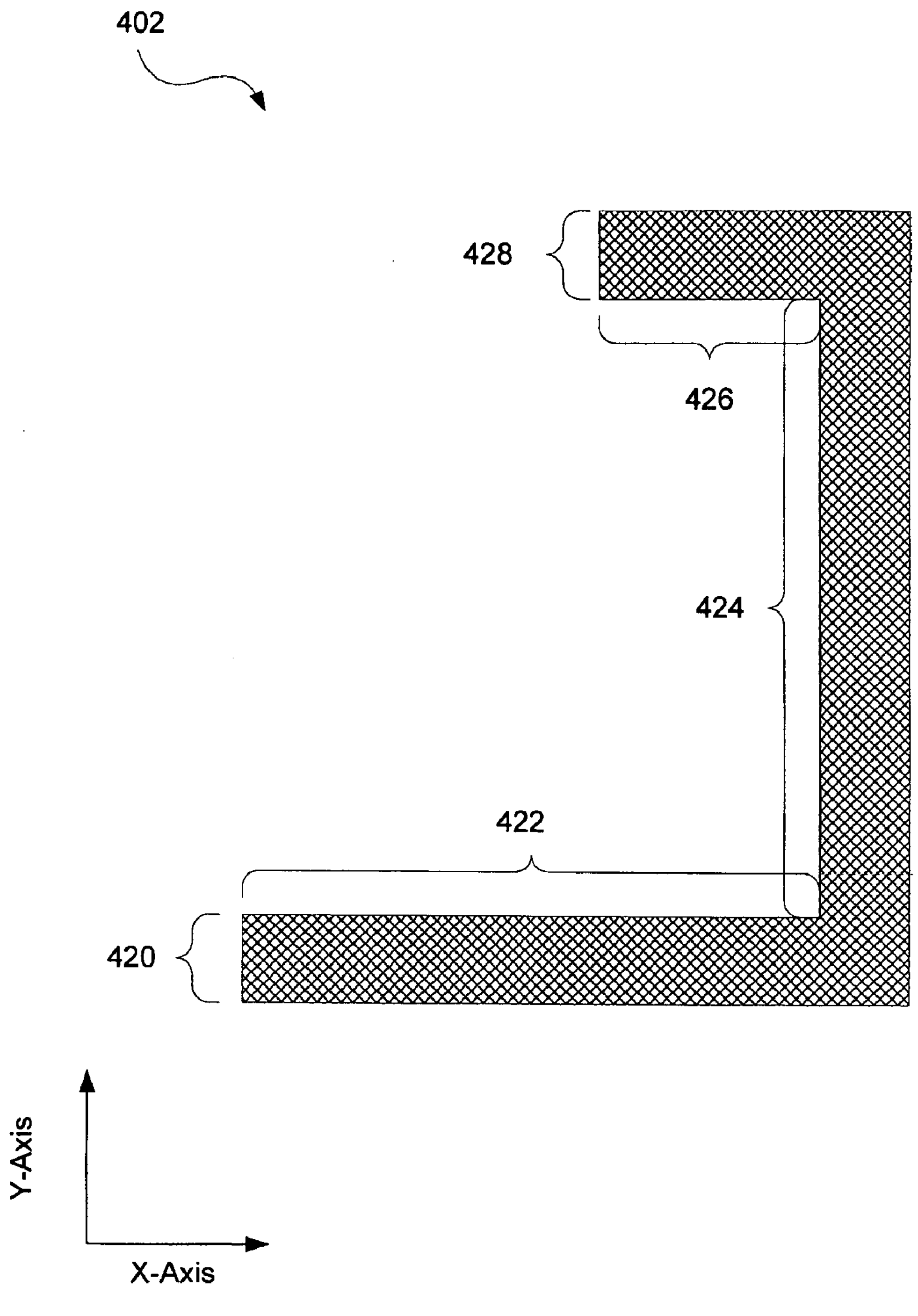
FIG. 4E (PRIOR ART)
Figure 5:
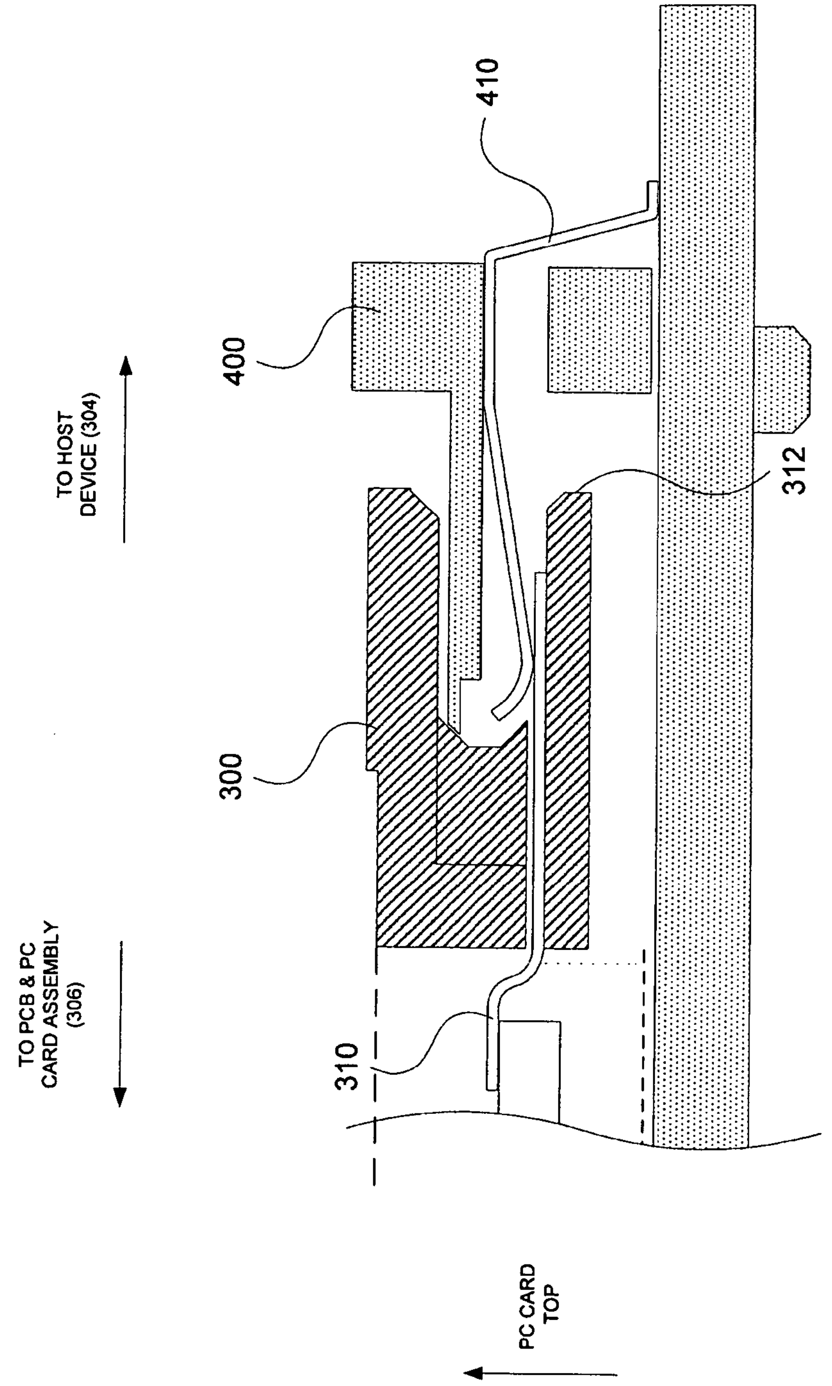
FIG. 5 (PRIOR ART)
FIG. 5 describes a simplified diagram of an EXPRESSCARD™ peripheral plug connector coupled to a receptacle connector.

To elaborate, each guide channel 402, as shown in FIGS. 4A–E, generally defines a substantially U-shaped cavity into which a guide rail 302, as shown in FIGS. 3A–F, may be inserted. Because three internal surfaces (top-inner-width surface 426, height-inner-width surface 424, and bottom-width-inner surface 422, as shown in FIG. 4E) of guide channel 402 are generally in contact with the corresponding surfaces (350, 352, and 354 in FIG. 3F) of guide rail 302 when the connector plug and connector receptacle are mated, a given level of mating and un-mating force is maintained.

A peripheral plug connector comprising a housing only in the bottom housing layer 330B and stopper layer 330C, however, would generally only contact each guide channel 402 on two surfaces (a layer of the height-inner surface 424, and bottom-width-inner surface 422 as shown in FIG. 4E). Subsequently, both the required mating and un-mating force for the peripheral connector, and the physical support in the guide channel may be reduced. One effect of this reduction may be to increase the likelihood of accidentally dislodging the connector.

In one embodiment, in a non-obvious fashion, the inventor has also provided a mechanism to sufficiently maintain the amount of force required to mate and un-mate the slim connector with a receptacle by extending both the width and the length of extended stopper 612. This modification is specifically not disclosed in the EXPRESSCARD™ specification, nor is there any motivation for it, since an EXPRESSCARD™ peripheral plug connector, as disclosed in the prior art, would not require an extended stopper 612 for proper structural support and sufficient mating and un-mating force.

Figure 6A:
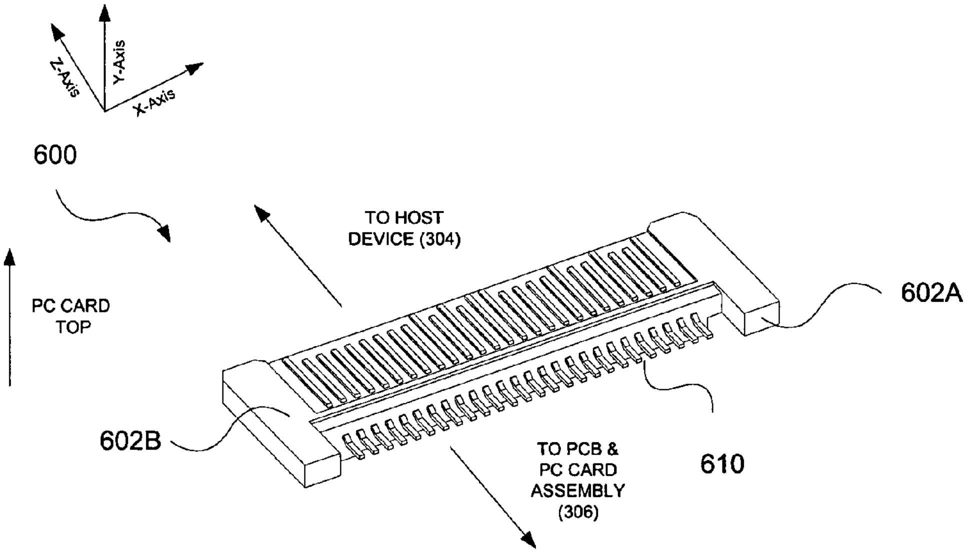
FIGS. 6A–F describe a set of simplified diagrams of an slim connector with a reduced thickness according to one embodiment of the invention.
Figure 6B:
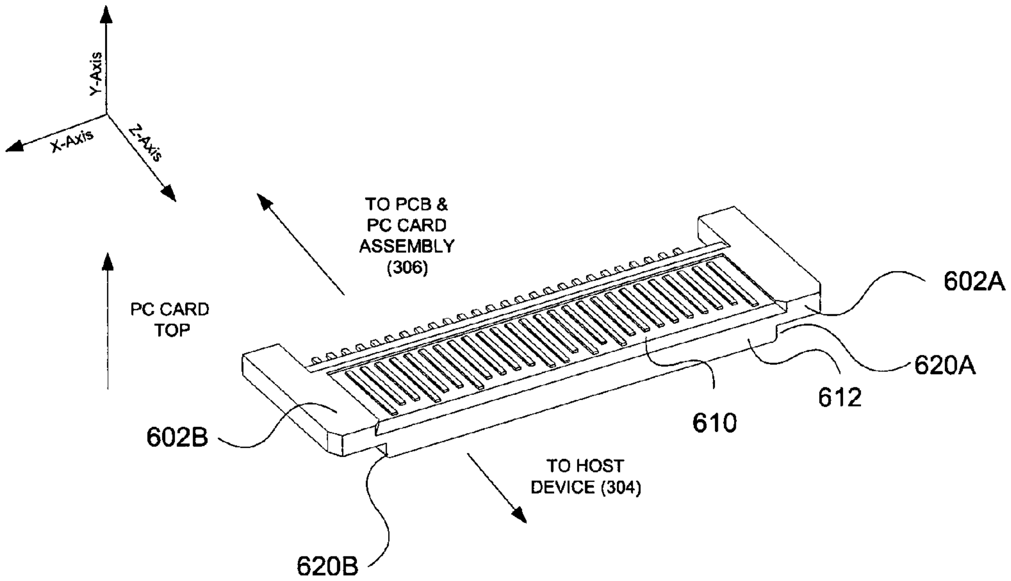
Figure 6C:
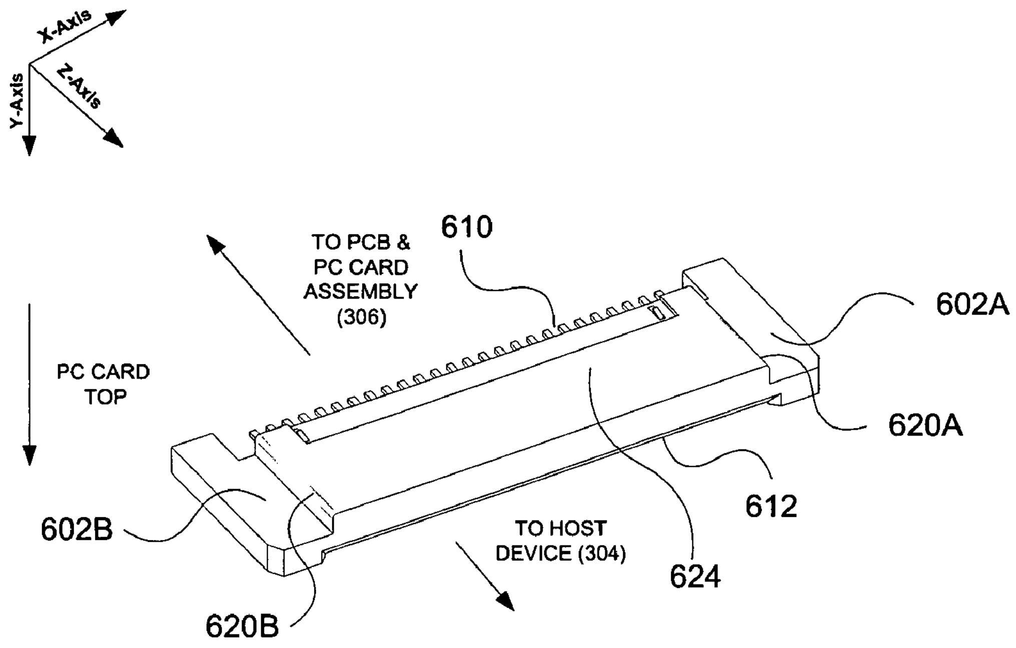

As seen in FIG. 6C, the extended stopper 612 includes a set of stopper vertical guide surfaces 620, which are oriented along the longitudinal axis of the plug. When properly mated to an EXPRESSCARD™ receptacle host connector, the set of stopper vertical guide surfaces 620 (in addition to the corresponding surfaces of guide rail 602), are able to maintain a substantial amount of contact with the three corresponding surfaces (height-inner surface 424, bottom-width-inner surface 422, and bottom-height surface 420) of a corresponding guide channel 402 of an EXPRESSCARD™ receptacle host connector, as shown in FIGS. 4A–E.

In addition, the enlarged volume area (e.g., width 634× length 632×height 621) of stopper 612 may provide a foundation for better alignment and more rigid and firmer contact with receptacle host connector 400, allowing alignment between lateral guides 602 and guide channels 402, as shown in FIGS. 4A–E. That is, additional rigidity is derived from stopper face (height 621×width 636) mating with the bottom height surface 420 of FIG. 4E.

Furthermore, the horizontal bottom surface of the plug has an enlarged area (i.e., surface area=width 634×length 632 in the x-z plane of stopper 612) may also be supported by the PCB of the motherboard of the host, on which the EXPRESSCARD™ host receptacle connector is mounted. That is, the plug may be made sufficiently thick such that the enlarged horizontal bottom surface contact the PCB of the mother board when the plug is inserted into the receptacle host connector, thereby sandwiching the plug in between the socket-side metal contacts of the receptacle host connector and the PCB of the motherboard. Note that since this bottom horizontal surface is substantially longer (and wider) than the stopper of the prior art EXPRESSCARD™ plug, additional rigidity is provided. The additional alignment provides added rigidity between the contacts and compensates the reduced contact due to reduced height.

In addition, the extended surface area created by the extended width 636 of extended stopper 612 (see FIGS. 6E–F) and height 621 increases the contact with bottom front lip 430 (see FIG. 4D) of the receptacle. This further increases the rigidity and improves alignment during mating.

FIG. 6A shows from the perspective of host device 304 a top view of slim connector 600 with a thickness 630 of about 2.6 mm in which a set of metal contacts 610 is exposed to the top, according to one embodiment of the invention. Note that the top housing layer 330A of FIG. 3F has been removed to reduce the thickness of the connector plug, rendering metal contacts 610 now exposed when viewed from the top. Accordingly, the improved connector plug is at least 25% thinner than the industry-standard EXPRESSCARD™ plug, and may even be closer to 50% thinner than the industry-standard EXPRESSCARD™ plug.

FIG. 6B shows a top view of peripheral plug connector 600 of FIG. 6A, from the perspective of host device 304, according to one embodiment of the invention. Note that the bottom substrate (shown by reference 606 in FIG. 7) includes two layers: bottom housing layer 330B and stopper layer 330C integrally formed therewith (e.g., by being formed together).

FIG. 6C shows a bottom view of the peripheral plug connector 600 of FIG. 6A, from the perspective of host device 304, with the addition of extended stopper 612, according to one embodiment of the invention. As previously described, extended stopper 612 may prevent the slim connector to be over inserted into a receptacle, damaging the set of metal contacts 610, and improves rigidity and alignment during mating.

Figure 6D:
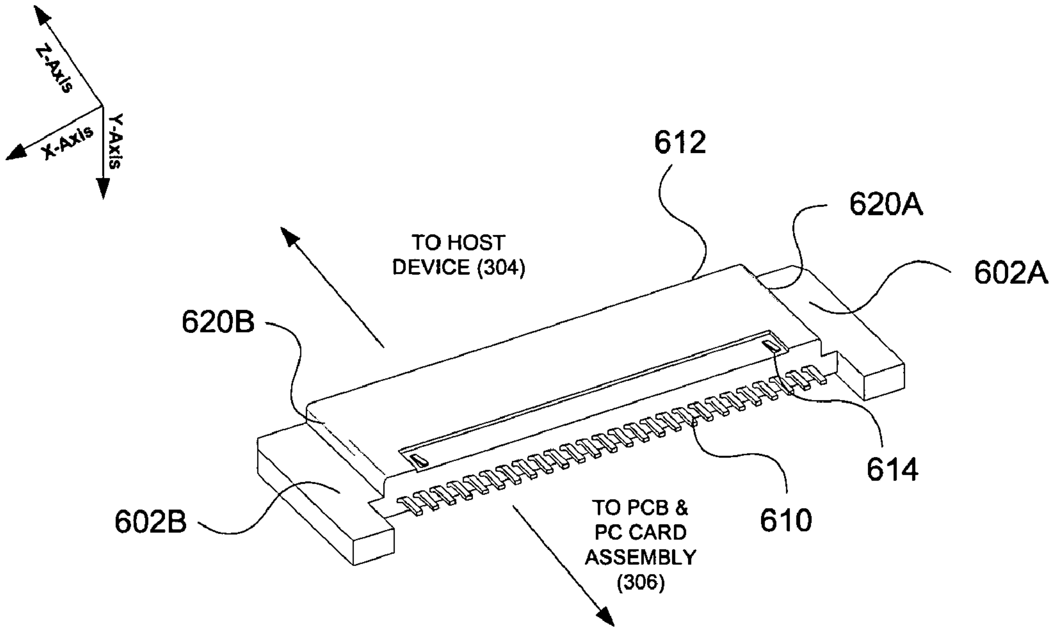

FIG. 6D shows a bottom view of the peripheral plug connector 600 of FIG. 6A, from the perspective of PCB & PC card assembly 306, according to one embodiment of the invention. Note FIGS. 6A to 6D share the same respective orientation for FIGS. 3A to 3D.

Figure 6E:
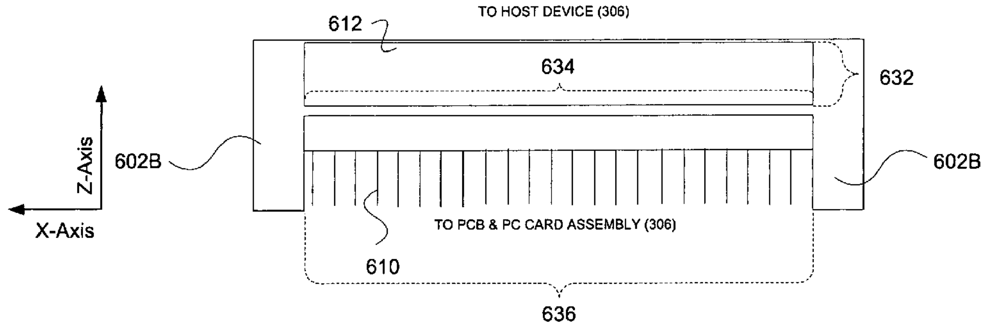

FIG. 6E shows a simplified top down view of the slim connector perpendicular to the x-z plane. Extended stopper 612 includes an extended length 632 and an extended width 634. As previously described, the enlarged surface area in the x-z plane of extended stopper 612 may be supported by a PCB and may provide added rigidity to the slim connector housing.

Figure 6F:
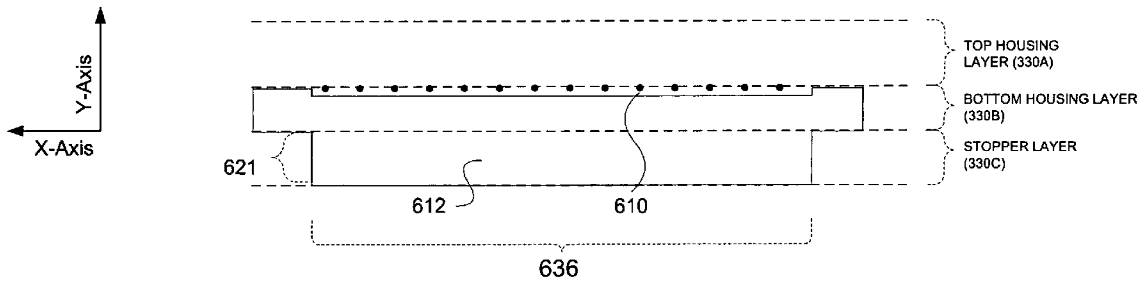

FIG. 6F shows a simplified side view of the slim connector from the connector front as if viewed from the socket side, perpendicular to the x-y plane. As previously described, the invention has removed the layer of the peripheral plug connector in the top housing layer 330A, as shown in FIG. 3F and has increased the volume and dimensions of extended stopper 612 in order to provide a foundation for better alignment and more rigid and firmer contact with receptacle host connector 400, shown in FIGS. 4A–E.

Figure 7:
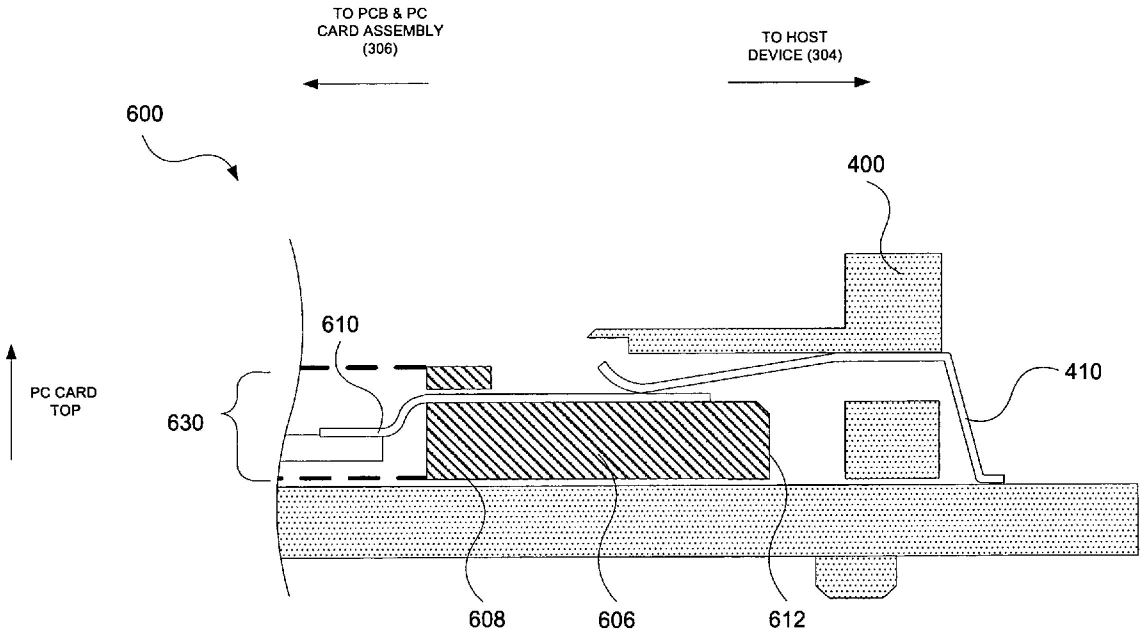
FIG. 7 describes a simplified diagram of a slim connector coupled to a receptacle connector, according to one embodiment of the invention.

Referring now to FIG. 7, a simplified diagram of slim connector 600 is shown coupled to a receptacle host connector 400, according to one embodiment of the invention. Metal contacts 610, representing the plug-side metal contacts, are shown disposed on a bottom substrate 606. As previously described, receptacle host connector 400 has spring-type metal contacts 410 (beam), representing the receptacle-side metal contacts that may make physical and electrical contact with a corresponding set of metal contacts 610 (blade) of slim connector 600. As can be appreciated from FIG. 7, the surfaces of the plug-side metal contacts 610 are essentially exposed when connector 600 is unplugged from the industry-standard receptacle connector 400. In addition, the surface area and volume of extended stopper 612 substantially maintains a sufficient mating and unmating force to minimize the likelihood of accidentally dislodging the connector.

In another embodiment, set of metal contacts 610 may be bent downward toward the bottom horizontal surface 608, which is in opposite to the upward bending as described in FIGS. 3A–E, allowing the EXPRESSCARD™ to maintain the approximate thickness 630 of the slim connector (e.g., about 2.6 mm), and not the larger thickness of the EXPRESSCARD™ peripheral plug connector of the prior art (e.g., about 5 mm), as shown in FIGS. 3A–E. That is, semiconductor chips and other components are able to fit on one side of the substrate printed circuit board. In contrast, bending the set of metal contacts 610 upward would generally reduce the benefit of slim connector 600 by increasing the thickness of the EXPRESSCARD™ beyond the approximate thickness 630 of slim connector 600.

In another embodiment, the set of metal contacts 610 are substantially straight (e.g., unbent, etc.) allowing chips and components to fit on two sides of the substrate board. Subsequently, the substrate may fit inside a thinner PC card assembly than normally allowed using the EXPRESSCARD™ peripheral plug connector of the prior, as shown in FIGS. 3.A–E.

Figure 8A:
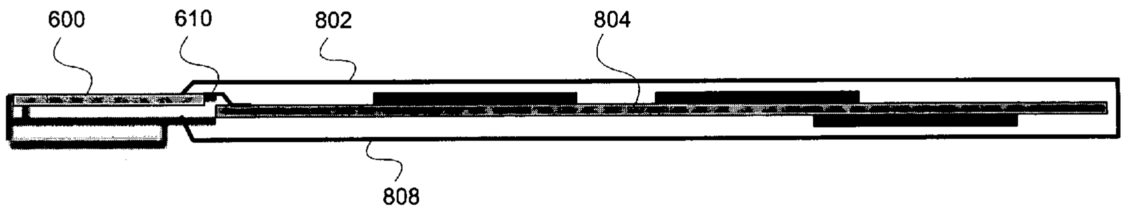
FIGS. 8A–B describe a simplified set of PC card assemblies, according to one embodiment of the invention.
Figure 8B:
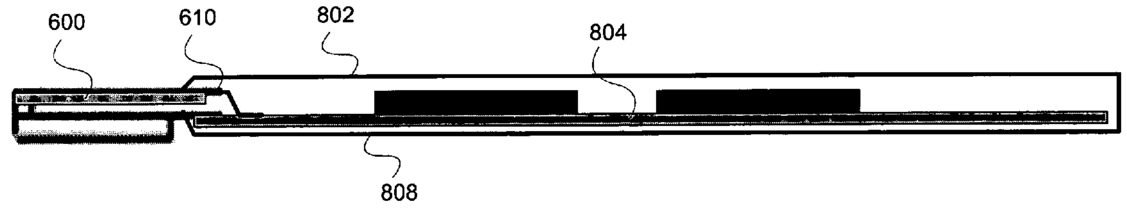

Referring now to FIGS. 8A–B, a simplified set of PC card assemblies are shown, according to one embodiment of the invention. FIG. 8A shows a PCB 804, coupled to slim connector 600 and sandwiched between a top cover 802 and a bottom cover 808 of a PC card assembly. In addition, PCB 804 may have IC's or other chips and components mounted on both surfaces of PCB 804.

FIG. 8B also shows a PCB 804, coupled to connector 600 and sandwiched between a top cover 802 and a bottom cover 808 of a PC card assembly. Unlike FIG. 8A, PCB 804 is configured to have IC's or other chips and components mounted only on one surface of PCB 804 by increasing the amount of bending of metal contacts 610.

Figure 9:
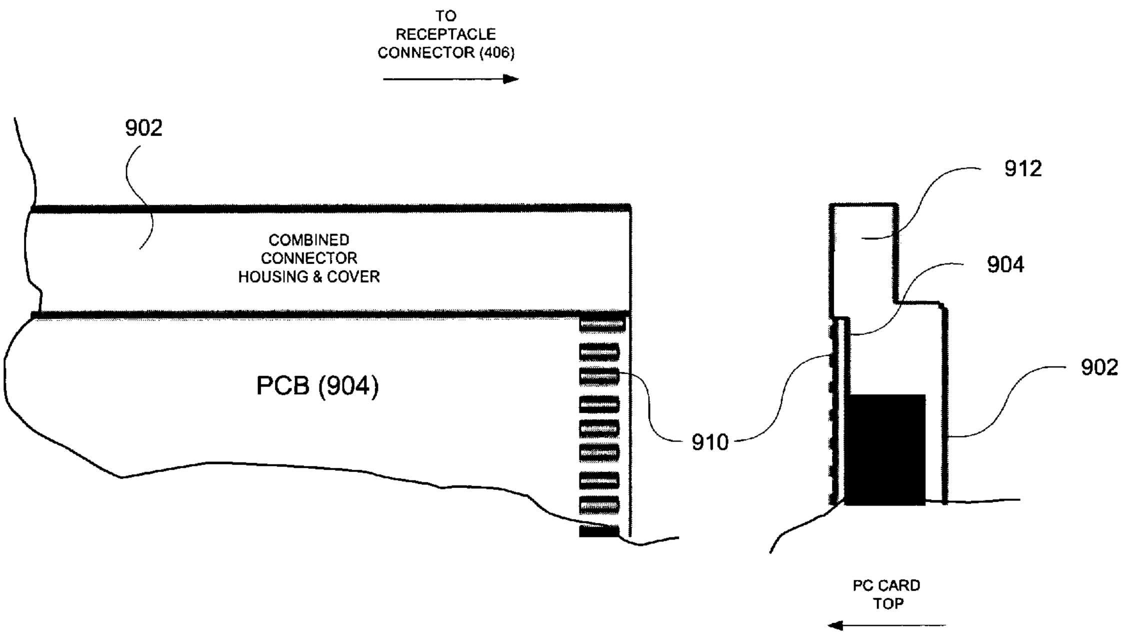
FIG. 9 describes a simplified diagram in which an integrated slim connector has been integrated with a PCB and PC card assembly, according to one embodiment of the invention.

Referring now to FIG. 9, a simplified diagram in which slim connector (integrated slim connector) 900 has been integrated with PCB 904 and PC card assembly 902, according to one embodiment of the invention. In a non-obvious way, this integration may eliminate the need of a discrete peripheral plug connector and the process step of soldering it to PCB 904. In this embodiment, the layer of PCB 904 originally intended to be coupled to the integrated slim connector 900 is modified by forming the set of metal contacts 910 directly on the PCB surface. In a non-obvious fashion, lateral guides 912 are directly built in to the PC card assembly itself, essentially making the front-part of the PCB board into a connector plug.

Figure 10:
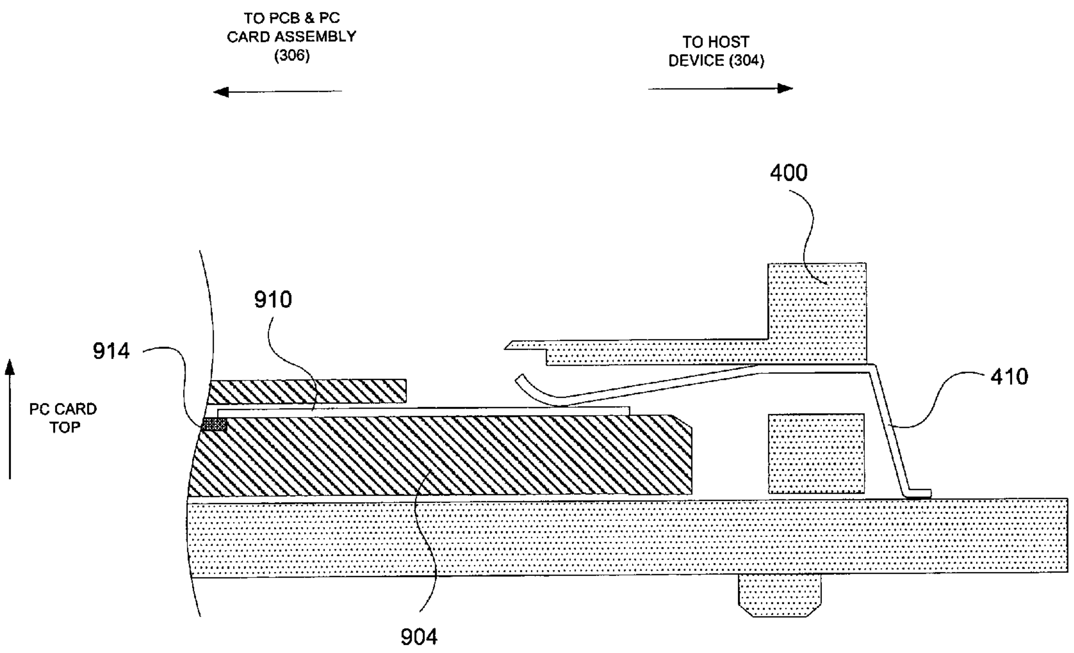
FIG. 10 describes a simplified diagram in which an integrated slim connector is coupled to a receptacle connector, according to one embodiment of the invention.

Referring now to FIG. 10, a simplified diagram in which integrated slim connector 900 of FIG. 9 is coupled to a receptacle host connector 400, according to one embodiment of the invention. As previously described, receptacle host connector 400 has spring-type metal contacts 910 (beam) that may make physical and electrical contact with a corresponding set of metal contacts 410 (blade) of integrated slim connector 900. As in FIG. 9, the set of metal contacts 910 may be placed directly upon electrical traces 914 on PCB 904.

Figure 11:
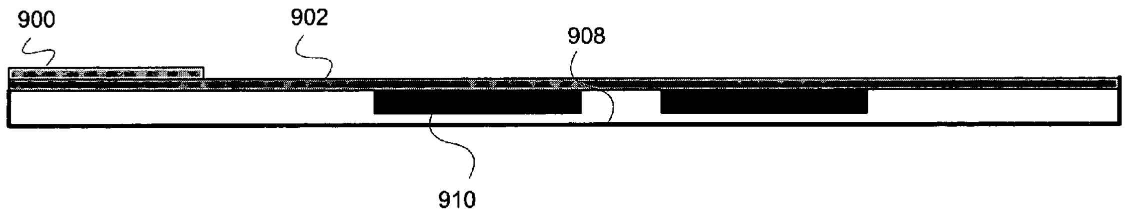
FIG. 11 describes a simplified diagram of an integrated slim connector sandwiched between a bottom cover and PCB, according to one embodiment of the invention.

FIG. 11 also shows an integrated slim connector 900 of FIG. 9 integrated into a combined PC card assembly. That is, PCB 902 is coupled to connector 900 and sandwiched between cover 908 and PCB 902. In addition, PCB 902 is configured to have IC's or other chips 910 and components mounted only on one surface of PCB 902.

It should be noted that although the current invention describes a slim connector for use with a peripheral device, it may also be used with a host device. Also, technologies and specifications other than EXPRESSCARD™ may be used.

Advantages of the invention include greater flexibility for small and non-traditional form-factor electronic devices. Additional advantages include minimizing manufacturing costs and increasing manufacturing throughput.

Having disclosed exemplary embodiments and the best mode, modifications and variations may be made to the disclosed embodiments while remaining within the subject and spirit of the invention as defined by the following claims.

What is claimed is:

1. A plug for coupling with a receptacle that conforms to the ExpressCard industry standard, comprising:

a bottom substrate;

a plurality of plug-side metal contacts disposed on said bottom substrate, said plurality of plug-side metal contacts being configured for coupling with receptacle-side metal contacts in said receptacle that conforms to the ExpressCard industry standard, thereby rendering said plug electrically compatible with said receptacle that conforms to the ExpressCard industry standard, wherein surfaces of said plurality of plug-side metal contacts that couple with said receptacle-side metal contacts are exposed when said plug is disconnected from said receptacle that conforms to the ExpressCard industry standard, wherein said bottom substrate has a sufficient thickness that allows said bottom substrate to be sandwiched between said receptacle-side metal contacts and a surface of a circuit board on which said receptacle that conforms to the ExpressCard industry standard is mounted when said plug is plugged into said receptacle that conforms to the ExpressCard industry standard.

2. The plug of claim 1 wherein said bottom substrate comprises a bottom housing layer and a stopper layer integrally formed therewith, said plurality of plug-side metal contacts being disposed on said bottom housing layer, said stopper layer having an enlarged dimension relative to a stopper of a plug that conforms to the ExpressCard industry standard.

3. The plug of claim 2 wherein said stopper layer includes two vertical longitudinal surfaces configured to mate with corresponding surfaces of said receptacle that conforms to the ExpressCard industry standard.

4. The plug of claim 2 wherein said stopper layer includes a horizontal bottom surface disposed parallel to a surface of said bottom substrate on which said plurality of plug-side metal contacts are disposed, said horizontal bottom surface being substantially longer in the longitudinal direction of said plug than a length of said stopper of said plug that conforms to the ExpressCard industry standard in said longitudinal direction.

5. The plug of claim 4 wherein said plurality of plug-side metal contacts are bent in a direction toward said horizontal bottom surface to couple with a circuit board implementing a peripheral device.

6. The plug of claim 1 wherein a portion of said plug that is inserted into said receptacle that conforms to the ExpressCard industry standard has a plug thickness that is at least 25% less than a thickness of said plug that conforms to the ExpressCard industry standard, said plug thickness being measured in a direction that is perpendicular to a longitudinal axis of said plug and that is also perpendicular to a plane formed by said plurality of plug-side metal contacts.

7. The plug of claim 6 wherein said stopper layer has stopper layer width that is wider than a width of said stopper of said plug that conforms to the ExpressCard industry standard, said stopper layer width being measured in a direction that is perpendicular to said longitudinal axis of said plug and that is parallel to said plane formed by said plurality of plug-side metal contacts.

8. The plug of claim 6 wherein said stopper layer has a stopper layer length that is longer than a length of said stopper of said plug that conforms to the ExpressCard industry standard, said stopper layer length being measured along said longitudinal axis of said plug.

9. A peripheral device configured to be plugged into a receptacle that conforms to the ExpressCard industry standard, comprising:

a plug having a bottom substrate and a plurality of plug-side metal contacts disposed on said bottom substrate, said bottom substrate comprises a bottom housing layer and a stopper layer integrally formed therewith, said plurality of plug-side metal contacts being configured for coupling with receptacle-side metal contacts in said receptacle that conforms to the ExpressCard industry standard, thereby rendering said plug electrically compatible with said receptacle that conforms to the ExpressCard industry standard, wherein surfaces of said plurality plug-side metal contacts that couple with said receptacle-side metal contacts are exposed when said plug is disconnected from said receptacle that conforms to the ExpressCard industry standard, wherein said bottom substrate has a sufficient thickness that allows said bottom substrate to be sandwiched between said receptacle-side metal contacts and a surface of a circuit board on which said receptacle that conforms to the ExpressCard industry standard is mounted when said peripheral device is plugged into said receptacle that conforms to the ExpressCard industry standard.

10. The peripheral device of claim 9 wherein said plurality of plug-side metal contacts are disposed on said bottom housing layer, said stopper layer has an enlarged dimension relative to a stopper of a plug that conforms to the ExpressCard industry standard.

11. The peripheral device of claim 10 wherein said stopper layer includes two vertical longitudinal surfaces configured to mate with corresponding surfaces of said receptacle that conforms to the ExpressCard industry standard.

12. The peripheral device of claim 10 wherein said stopper layer includes a horizontal bottom surface disposed parallel to a surface of said bottom substrate on which said plurality of plug-side metal contacts are disposed, said horizontal bottom surface being substantially longer in the longitudinal direction of said plug than a length of said stopper of plug that conforms to the ExpressCard industry standard in said longitudinal direction.

13. The peripheral device of claim 9 wherein a portion of said plug that is inserted into said receptacle that conforms to the ExpressCard industry standard has a plug thickness that is at least 25% less than a thickness of said plug that conforms to the ExpressCard industry standard, said plug thickness being measured in a direction that is perpendicular to a longitudinal axis of said plug and that is also perpendicular to a plane formed by said plurality of plug-side metal contacts.

14. The peripheral device of claim 13 wherein said stopper layer has stopper layer width that is wider than a width of said stopper of said plug that conforms to the ExpressCard industry standard, said stopper layer width being measured in a direction that is perpendicular to said longitudinal axis of said plug and that is parallel to said plane formed by said plurality of plug-side metal contacts.

15. The peripheral device of claim 13 wherein said stopper layer has a stopper layer length that is longer than a length of said stopper of said plug that conforms to the ExpressCard industry standard, said stopper layer length being measured along said longitudinal axis of said plug.

16. The peripheral device of claim 12 wherein said plurality of plug-side metal contacts are bent in a direction toward said horizontal bottom surface to couple with a circuit board of said peripheral device.

17. The peripheral device of claim 16 wherein integrated circuits are populated only on one side of said circuit board of said peripheral device.

18. The peripheral device of claim 16 wherein integrated circuits are populated on both sides of said circuit board of said peripheral device.

19. A peripheral device configured to be plugged into a receptacle that conforms to the ExpressCard industry standard, comprising:

a circuit board having thereon a plurality of integrated circuit chips;

a plug portion integrally formed at one end of said circuit board, said plug portion having a bottom substrate and a plurality of plug-side metal contacts disposed on said bottom substrate, said plurality of plug-side metal contacts being configured for coupling with receptacle-side metal contacts in said receptacle that conforms to the ExpressCard industry standard, thereby rendering said plug portion electrically compatible with said receptacle that conforms to the ExpressCard industry standard, wherein surfaces of said plurality plug-side metal contacts that couple with said receptacle-side metal contacts are exposed when said plug portion is disconnected from said receptacle that conforms to the ExpressCard industry standard, wherein said bottom substrate has a sufficient thickness that allows said bottom substrate to be sandwiched between said receptacle-side metal contacts and a surface of a circuit board on which said receptacle that conforms to the ExpressCard industry standard is mounted when said peripheral device is plugged into said receptacle that conforms to the ExpressCard industry standard.

20. The peripheral device of claim 19 wherein said bottom substrate comprises a bottom housing layer and a stopper layer integrally formed therewith, said plurality of plug-side metal contacts being disposed on said bottom housing layer, said stopper layer having an enlarged dimension relative to a stopper of a plug that conforms to the ExpressCard industry standard.

21. The peripheral device of claim 20 wherein said stopper layer includes two vertical longitudinal surfaces configured to mate with corresponding surfaces of said receptacle that conforms to the ExpressCard industry standard.

22. The peripheral device of claim 20 wherein said stopper layer includes a horizontal bottom surface disposed parallel to a surface of said bottom substrate on which said plurality of plug-side metal contacts are disposed, said horizontal bottom surface being substantially longer in the longitudinal direction of said plug portion than a length of said stopper of said plug that conforms to the ExpressCard industry standard in said longitudinal direction.

23. The peripheral device of claim 19 wherein a portion of said plug portion that is inserted into said receptacle that conforms to the ExpressCard industry standard has a plug thickness that is at least 25% less than a thickness of said plug that conforms to the ExpressCard industry standard, said plug thickness being measured in a direction that is perpendicular to a longitudinal axis of said plug portion and that is also perpendicular to a plane formed by said plurality of plug-side metal contacts.

24. The peripheral device of claim 23 wherein said stopper layer has stopper layer width that is wider than a width of said stopper of said plug that conforms to the ExpressCard industry standard, said stopper layer width being measured in a direction that is perpendicular to said longitudinal axis of said plug portion and that is parallel to said plane formed by said plurality of plug-side metal contacts.

25. The peripheral device of claim 23 wherein said stopper layer has a stopper layer length that is longer than a length of said stopper of said plug that conforms to the ExpressCard industry standard, said stopper layer length being measured along said longitudinal axis of said plug portion.

26. The peripheral device of claim 19 wherein said plurality of integrated circuits are populated only on one side of said circuit board of said peripheral device.

27. The peripheral device of claim 19 wherein said plurality of integrated circuits are populated on both sides of said circuit board of said peripheral device.

* * * * *